United States Patent
Ohmart

(10) Patent No.: US 9,880,195 B2
(45) Date of Patent: Jan. 30, 2018

(54) TEST SYSTEMS AND METHODS OF TESTING DEVICES

(71) Applicant: Texas Instruments Incorporated, Dallas, TX (US)

(72) Inventor: Dale Vincent Ohmart, Sugar Land, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 174 days.

(21) Appl. No.: 14/882,704

(22) Filed: Oct. 14, 2015

(65) Prior Publication Data

US 2017/0108533 A1 Apr. 20, 2017

(51) Int. Cl.
*G01R 31/02* (2006.01)
*G01R 1/04* (2006.01)
*G01R 31/28* (2006.01)

(52) U.S. Cl.
CPC ....... *G01R 1/0441* (2013.01); *G01R 31/2865* (2013.01)

(58) Field of Classification Search
USPC ................ 324/756.02–756.07, 73.1
See application file for complete search history.

(56) References Cited

U.S. PATENT DOCUMENTS

| 5,289,118 A * | 2/1994 | Crisafulli | G01R 31/28 324/73.1 |
| 8,400,180 B2 | 3/2013 | Roberts | |
| 2015/0268294 A1* | 9/2015 | Chiang | H04B 17/0085 702/121 |

* cited by examiner

*Primary Examiner* — Vincent Q Nguyen
(74) *Attorney, Agent, or Firm* — Kenneth Liu; Charles A. Brill; Frank D. Cimino

(57) ABSTRACT

A test system for performing a plurality of tests on a plurality of devices includes a tester having a plurality of tester pins and at least one socket, wherein the plurality of devices are received in the at least one socket. The test system further includes a plurality of multiplexers, wherein each of the multiplexers has an input coupled to one of the plurality of tester pins and each of the multiplexers has outputs coupled to individual device pins of the devices. The tester is configurable to perform a first test on a first plurality of devices and a second test on a second plurality of devices without disconnecting the devices from the at least one socket.

20 Claims, 4 Drawing Sheets

TEST SYSTEMS AND METHODS OF TESTING DEVICES

BACKGROUND

Some integrated circuits (ICs) and other devices have a large number of pins or contacts, which require an extended testing period and specialized test equipment to test the devices. Three tests commonly applied to devices are structural tests, parametric tests, and functional tests. Structural testing typically involves operating a built in self test (BIST) in the device. For example, structural testing may involve applying voltages to certain pins or conductors on the device and monitoring outputs that provide information as to whether the device is operating properly. Structural testing on a digital circuit may check all the gates to make sure they are operating correctly. Structural testing typically does not test all the pins of the device and is very time consuming. In some examples, a device with one-hundred pins may only require a few pins contacting the test station to complete the structural test, but the test may take as long as a minute to complete. Short circuits and open circuits on the remaining pins are not tested during structural testing.

Functional testing requires coupling between the test station and all the pins of the device. The functional testing may include tests for open circuits, short circuits, proper voltage levels, and other possible defects in the device. Unlike structural testing, functional testing does not run the BIST, but it typically performs tests on all the pins. A functional test may take one second for a one-hundred pin circuit whereas structural testing on the same device may take as long as one minute. Parametric testing is similar to functional testing in that it typically requires contact with all the pins of the device, but it tests ranges of the device. For example, it may test to assure that a current draw does not exceed a specific limit when a range of voltages is applied to a pin. Parametric testing takes longer than functional testing, but not as long as structural testing. In some examples, the one-hundred pin device described above may take two seconds to perform the parametric testing.

Conventional test equipment performs one of the three tests, structural, functional, or parametric. Accordingly, fully testing circuits requires the circuits to be connected and disconnected from different test equipment for each test. This connecting and disconnecting is time consuming and the requirement of different test equipment for each test is costly.

SUMMARY

A test system for performing a plurality of tests on a plurality of devices includes a tester having a plurality of tester pins and at least one socket. The plurality of devices are received in the at least one socket. The test system further includes a plurality of multiplexers, wherein each of the multiplexers has an input coupled to one of the plurality of tester pins and each of the multiplexers has outputs coupled to individual device pins of the devices. The tester is configurable to perform a first test on a first plurality of devices and a second test on a second plurality of devices without disconnecting the devices from the at least one socket.

DETAILED DESCRIPTION

Testing methods and testing systems for performing a plurality of tests on a plurality of devices during a single insertion of the devices into a socket are described herein. Connectors or socket pins on the socket couple device pins on the devices to a tester to perform different tests on the devices without the need to remove the devices from the socket. The methods and test systems described herein eliminate the conventional test methods that require multiple device insertions into different sockets coupled to different testers to perform the different tests. In the examples described herein, structural tests, functional tests, and parametric tests are performed by a single test system after the devices are inserted or otherwise coupled to a socket.

Structural testing typically involves applying voltages to certain pins or conductors on the devices and monitoring outputs of the devices that provide information as to whether the devices are operating properly. Structural testing typically does not require electrical contact with all the pins of the devices and is very time consuming. In some examples, a device with one-hundred pins may only require a few pins contacting the tester to complete the structural test. Because only a few pins are contacted, short circuits and open circuits on the remaining pins are not tested during structural testing.

Functional testing typically requires electrical coupling between the tester and all the pins of the device. Functional testing typically includes tests for open circuits, short circuits, proper voltage levels, and other possible defects on the circuit. Unlike structural testing, functional testing does not run a built in self test (BIST), but it typically performs tests requiring contact with all the pins on the devices. A functional test may take one second for a one-hundred pin device whereas structural testing on the same device may take as long as one minute. Parametric testing is similar to functional testing in that it typically requires contact with all the pins of the device, but it tests ranges of the device. For example, it may test to assure that a current draw on a device does not exceed specific limits over specific voltage ranges. Parametric testing typically takes longer than functional testing, but not as long as structural testing.

Figure 1:
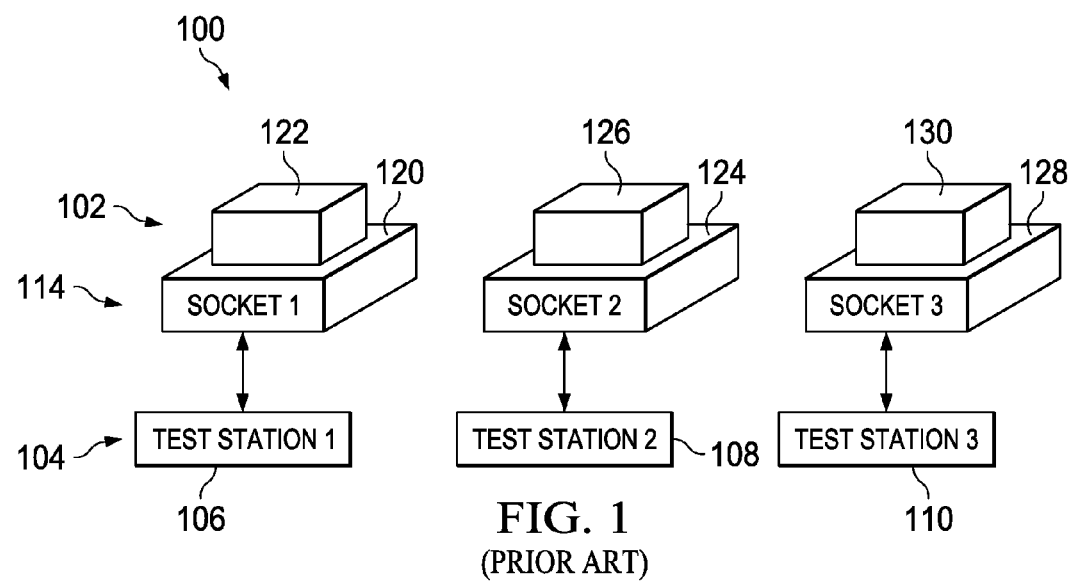
FIG. 1 is a block diagram of a prior art test system.

FIG. 1 is a diagram of a prior art test system 100. In the example of FIG. 1, devices 102 are undergoing a plurality of tests, which in the examples described herein are structural tests, functional tests, and parametric tests that are performed by a plurality of test stations 104. The test system 100 includes three test stations 104, which are referred to individually as test station one 106, test station two 108, and test station three 110. A plurality of sockets 114 are coupled between the devices 102 and the test stations 104. A first socket 120 is coupled between a first device 122 and the test station one 106, a second socket 124 is coupled between a second device 126 and test station two 108, and a third socket 128 is coupled between a third device 130 and test station three 110.

The test system 100 requires that the devices 102 be removed from their sockets 114 after each test station performs its test and placed in another one of the sockets 104 for additional testing by another test station. For example, test station one 106 may perform structural testing, test station two 108 may perform functional testing, and test station three 110 may perform parametric testing. In some embodiments, the functional and parametric testing is performed on a single test station, but the structural testing is still performed on a separate test station.

In the example of FIG. 1, the first device 122 is inserted into the first socket 120 where test station one 106 performs structural testing. Once the structural testing is completed by test station one 106, the first device 122 is removed from the first socket and inserted into the second socket 124 (after the second device 126 is removed from the second socket 124) where functional testing is performed by test station two 108. After test station two 108 completes the functional testing, the first device 122 is removed from the second socket 124 and inserted into the third socket 128 where parametric testing is performed by test station three 110. After test station three 110 has completed its testing, the first device 122 is removed from the third socket 128 and sent to the next stage in manufacturing.

Testing a device using the test system 100 requires that the circuit be coupled and uncoupled from three sockets in order to perform all three tests, which is very time consuming. In some examples, the test stations 104 may be coupled to a plurality of sockets or the sockets may receive a plurality of devices. Even in these situations, the testing time is long because the devices have to be inserted into and removed from three sockets.

Figure 2:
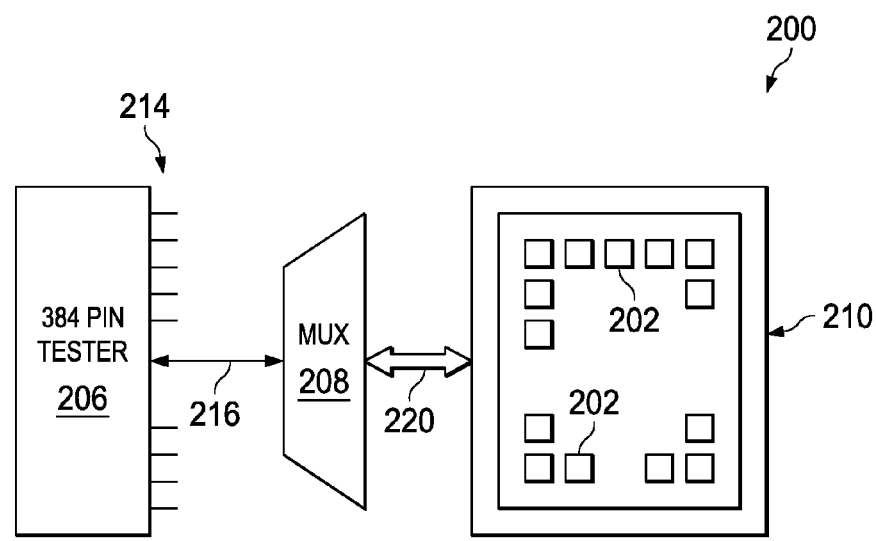
FIG. 2 is a block diagram of a test system that tests a plurality of devices.

FIG. 2 is a block diagram of a test system 200 that tests a plurality of devices under test (DUTs) 202, which are sometimes referred to herein simply as the devices 202. In the examples described herein, the test system 200 tests 64 DUTs 202, however, the test system 200 may be adapted to test any number of DUTs 202 as will be appreciated by those skilled in the art. The test system 200 includes a tester 206, a plurality of multiplexers illustrated by a single multiplexer 208 in FIG. 2, and a socket 210. The multiplexers may pass signals from the tester 206 to the DUTs 202 and from the DUTs 202 to the tester 206. The socket 210 may include a plurality of individual sockets that accept individual DUTs 202. In the example of FIG. 2, the tester 206 is a 384 pin tester, meaning that it has 384 tester pins 214 that are able to be coupled to the device pins (not shown) on the DUTs 202 by way of the multiplexers. Due to illustration limitations, only a few of the 384 tester pins 214 are shown in FIG. 2. The tester 206 is configurable to perform a plurality of tests, such as structural, functional, and parametric testing. For example, the tester pins 214 are configured to output or receive information to or from the devices 202 depending on which tests the tester 206 is running.

All of the tester pins 214 of the tester 206 that are used to test the DUTs 202 are coupled to inputs of multiplexers. The input of the multiplexer as used here is a single port on a multiplexer that couples to one of a plurality of ports that are referred to as the outputs of the multiplexers. Accordingly, the multiplexers may function as multiplexers, demultiplexers, or switches. As described above only the multiplexer 208 is shown in FIG. 2. A single tester pin 216 of the plurality of tester pins 214 couples the input of the multiplexer 208 to the tester 206. The description of the multiplexer 208 and the connections thereto are applicable to all the multiplexers coupled to the tester pins 214. The multiplexer 208 is coupled to the socket 210 by a plurality of data lines 220. In the example of FIG. 2, the multiplexer 208 is a 17:1 device so there are 17 individual data lines in the plurality of data lines 220. As described in greater detail below 16 of the individual data lines are coupled to device pins on 16 individual DUTs 202.

Figure 3:
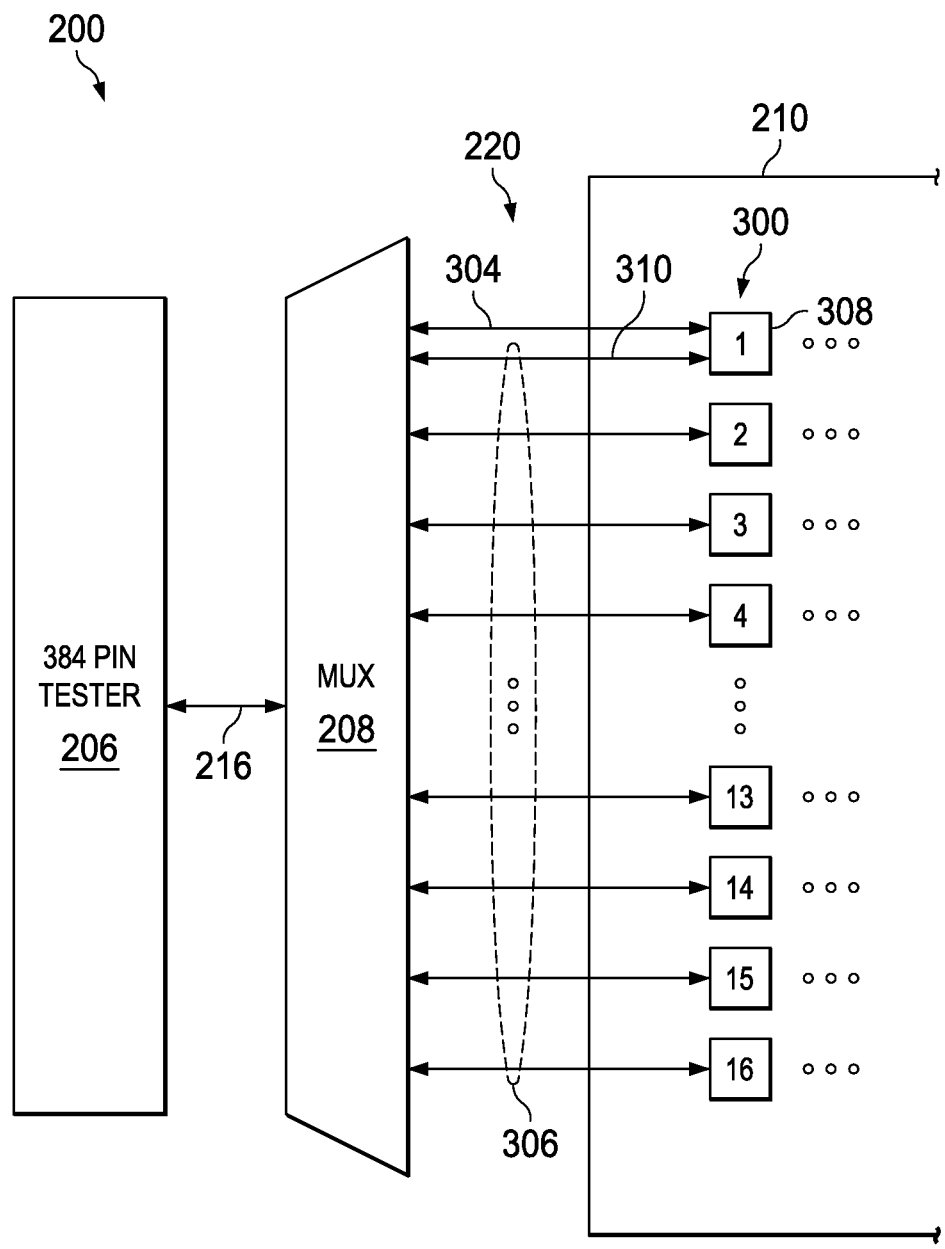
FIG. 3 is a block diagram of the multiplexer of FIG. 2 coupled to a plurality of devices under test.

Additional reference is made to FIG. 3, which is a block diagram of the multiplexer 208 of FIG. 2 coupled to a plurality of devices under test (DUTs) 300 by the plurality of data lines 220. The data lines 220 are described as being coupled to the DUTs 300, however, the data lines are coupled to socket pins (not shown) on the socket 210 which are coupled to device pins (not shown) on the DUTs 300. Two of the plurality of data lines 220 are coupled to a single one of the DUTs 300, so the multiplexer 208 is coupled to 16 individual DUTs 300. A first data line 304 is coupled to one of the DUTs 300 and the remaining second data lines 306, constituting the plurality of data lines 220 are each coupled to an individual one of the DUTs 300. A first DUT 308 has the two data lines, the first data line 304 and a second data line 310 coupled thereto, wherein the second data line 310 is one of the second data lines 306. All of the second data lines 306 may couple to the same device pins of different DUTs 300. For example, the DUTs 300 may each have 96 pins each and the second data lines 306 may couple to the fifth pin of each of the DUTs 300. Other multiplexers (not shown in FIG. 3) couple the tester 206 to other device pins of the DUTs 300.

The first data line 304 couples to a device pin on one of the DUTs 300 that serves for structural testing. For example, the first data line 304 may couple to the fourth pin of the first DUT 308. In some examples, the first data line 304 may couple to the same pin on the first DUT 308 as the second data line 310. As described above, structural testing is performed as a different operation than the functional and parametric testing, so the first data line 304 is used for testing that is different than testing using the second data lines 306. Structural testing typically involves a few connections between the tester 206 and each of the DUTs 300, so other multiplexers (not shown in FIG. 3) couple other first data lines to each of the DUTs 300 to perform the structural testing.

Figure 4:
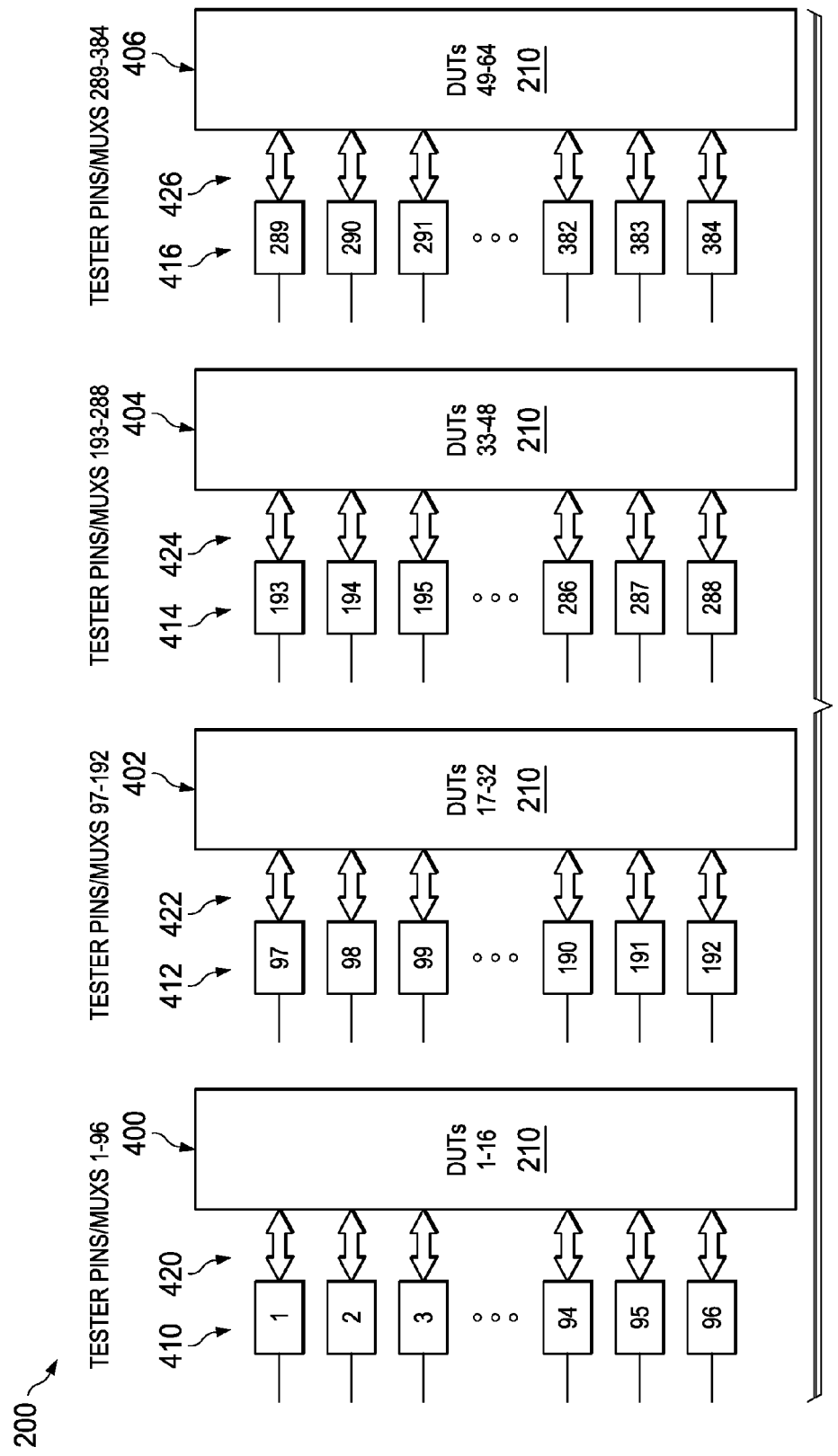
FIG. 4 is a block diagram of the test system of FIG. 2 showing the socket and multiplexer configuration.

Additional reference is made to FIG. 4, which is a block diagram of the test system 200 showing the socket 210 and the multiplexer configuration. For illustration purposes, the socket 210 is shown in four sections, referred to individually as the first section 400, the second section 402, the third section 404, and the fourth section 406. Each of the sections 400-406 has 16 DUTs (202 from FIG. 2) coupled thereto. The DUTs are referred to individually as DUTs 1 through 64. Each of the DUTs has 96 device pins (not shown) that are connected to socket pins (not shown) in the socket 210. As described above, the tester (not shown in FIG. 4) has 384 tester pins 214, so there are 384 multiplexers, which are referred to individually as MUX 1 through MUX 384. The tester pins 214, FIG. 2, of the tester 206 have the same references as multiplexors, being tester pin 1 through tester pin 384.

Like the socket 210, the multiplexors shown in FIG. 4 are arranged in four groups, a first group 410 having MUX 1 through MUX 96, a second group 412 having MUX 97 through MUX 192, a third group 414 having MUX 193 through MUX 288, and a fourth group 416 having MUX 289 through MUX 384. A plurality of data lines 420 couples the first group 410 of multiplexors to DUTs 1-16, a plurality of data lines 422 couples the second group 412 of multiplexors to DUTs 17-32, a plurality of data lines 424 couples the third group 414 of multiplexors to the DUTs 33-48, and a plurality of data lines 426 couples the fourth group 416 of multiplexors to the DUTs 49-64. As described in FIG. 3, the pluralities of data lines 420 couple the individual device pins of the DUTs to the multiplexers by way of socket pins or other electrical connectors on the socket 210.

The test system 200 tests all the DUTs in structural, functional, and parametric tests as described below. The DUTs described herein require six device pins to be contacted with the tester 206 to complete the structural testing. The DUTs require all device pins to be contacted with the tester 206 to complete the functional and parametric testing. During structural testing the first data lines 304 as described in FIG. 3 are coupled to the DUTs. Because only six connections are required for testing, all of the 64 DUTs may be coupled to the tester 206 simultaneously by way of the 384 multiplexers. With reference to FIG. 4, groups of six multiplexers are coupled to each of the DUTs during structural testing. For example, MUX 1 through MUX 6 are coupled to DUT 1, MUX 7 through MUX 12 are coupled to DUT 2. As can be appreciated from FIG. 4, all of the first group 410 of multiplexers are coupled to all the DUTs 1-16. Likewise, all the other multiplexers are coupled to the DUTs in their respective groups. At this point, all the DUTs are coupled to all 384 tester pins 214 of the tester 206 and the tester 206 may perform the structural testing on all the DUTs. For example, the tester 206 may configure itself or be configured to initiate built in self test programs to initiate within the DUTs and monitor data generated by the DUTs in response to the built in self test programs.

In the example of FIG. 4, functional and parametric testing are performed on four DUTs simultaneously. By simultaneously testing four DUTs, all of the 384 tester pins 214 of the tester 206 are in use. The first group 410 of multiplexers couples to one of the DUTs 1-16 in the first section 400. For example, MUX 25 couples to device pin 25 of DUT 1 and MUX 26 couples to device pin 26 of DUT 1. In a similar manner, MUX 121 couples to device pin 25 of DUT 17, MUX 217 couples to device pin 25 of DUT 33, and MUX 313 couples to device pin 25 of DUT 49. At this point all the tester pins 214 of the tester 206 are coupled to DUTs 1, 17, 33, and 49 and the tester 206 may perform functional and parametric testing on these devices using all of its tester pins 214. More specifically, the tester 206 configures the tester pins 214 with internal components to perform the functional and parametric tests. When these tests are complete, other DUTs are tested. For example, the multiplexers may then couple DUTs 2, 28, 34, and 50 to the tester 206, which performs functional and parametric tests on these DUTs. The functional and parametric tests are completed sixteen times to test all of the 64 DUTs.

The above-described test system 200 is based on a 384 pin tester 206 that tests 64 DUTs having 96 pins each and wherein six of the 96 device pins are required to be contacted for structural testing. Such a configuration uses all the pins 214 of the tester 206 during all the tests, so no testing hardware sits idle during testing. This optimal configuration is due to the number of tester pins 214 being a multiple of the number of device pins on each DUT. Additionally, the number of device pins required for structural testing is also a multiple of the number of tester pins 214. Other tester and DUT pin configurations may be utilized to give results wherein all of the pins of a tester or most of the pins are used during all the testing. In some examples, the test system 200 performs tests based on the IEEE 1149.1 testing standard.

Figure 5:
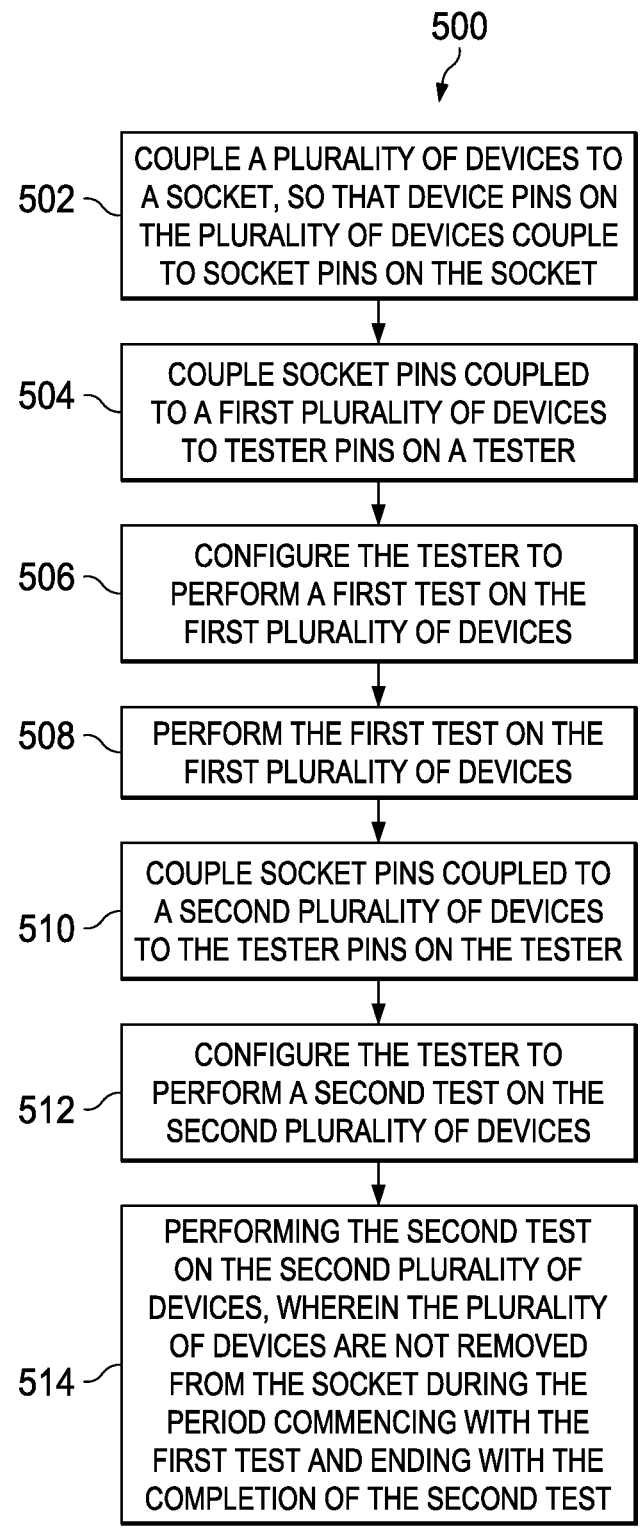
FIG. 5 is a flow chart illustrating a method of operating the test system of FIG. 2.

The method of testing is further described in reference to the flowchart 500 of FIG. 5. Step 502 includes coupling a plurality of devices to a socket, so that device pins on the plurality of devices couple to socket pins on the socket. Step 504 includes coupling socket pins coupled to a first plurality of devices to tester pins on a tester. Step 506 includes configuring the tester to perform a first test on the first plurality of devices. Step 508 includes performing the first test on the first plurality of devices. Step 510 includes coupling socket pins coupled to a second plurality of devices to the tester pins on the tester. Step 512 includes configuring the tester to perform a second test on the second plurality of devices. Step 514 includes performing the second test on the second plurality of devices, wherein the plurality of devices are not removed from the socket during the period commencing with the first test and ending with the completion of the second test.

While some examples of test systems and test methods have been described in detail herein, it is to be understood that the inventive concepts may be otherwise variously embodied and employed and that the appended claims are intended to be construed to include such variations except insofar as limited by the prior art.

What is claimed is:

1. A test system for performing a plurality of tests on a plurality of devices, the test system comprising:
   a tester having a plurality of tester pins;
   at least one socket, wherein the plurality of devices are receivable in the at least one socket and the plurality of devices includes a first plurality of devices and a second plurality of devices; and
   a plurality of multiplexers, each of the multiplexers having a single input coupled to a single respective one of the plurality of tester pins, each of the multiplexers having outputs for coupling to device pins of individual devices of the plurality of devices;
   wherein the tester is configurable to perform a first test on the first plurality of devices and the second test on the second plurality of devices without disconnecting the first and second pluralities of devices from the at least one socket.

2. The test system of claim 1, wherein all of the tester pins are coupled to device pins during at least one of the first and second tests.

3. The test system of claim 1, wherein all of the tester pins are coupled to device pins during both the first test and the second test.

4. The test system of claim 1, wherein the plurality of tests include at least one of a structural test, a functional test, and a parametric test.

5. The test system of claim 1, wherein the number of tester pins is a multiple of the number of device pins on a single device of the plurality of devices.

6. The test system of claim 1, wherein the number of device pins per device coupled to tester pins during the first test is a multiple of the total number of tester pins.

7. The test system of claim 1, wherein the number of device pins per device coupled to tester pins during the first test and the second test is a multiple of the total number of tester pins.

8. The test system of claim 1, wherein the multiplexers couple their outputs to device pins on the first plurality of devices for the first test, and wherein the multiplexers couple their outputs to pins on the second plurality of devices for the second test.

9. The test system of claim 1, wherein the plurality of devices further includes a third plurality of devices, and wherein the tester is configurable to perform the first test on the first plurality of devices, the second test on the second plurality of devices, and a third test on the third plurality of devices without disconnecting the first, second, and third pluralities of devices from the at least one socket.

10. A method for performing a plurality of tests on a plurality of devices, the method comprising:
coupling a plurality of devices to a socket, so that device pins on the plurality of devices couple to socket pins on the socket, wherein the plurality of devices includes a first plurality of devices and a second plurality of devices;
coupling socket pins coupled to the first plurality of devices to tester pins on a tester;
configuring the tester to perform a first test on the first plurality of devices, the first test being selected as one of a structural test, a functional test, and a parametric test;
performing the first test on the first plurality of devices;
coupling socket pins coupled to the second plurality of devices to the tester pins on the tester;
configuring the tester to perform a second test on the second plurality of devices; and
performing the second test on the second plurality of devices that is of a type different from the first test, the second test being selected as a different one of the structural test, the functional test, and the parametric test;
wherein the first and second pluralities plurality of devices are not removed from the socket during the period commencing with the first test and ending with the completion of the second test.

11. The method of claim 10, wherein the first test is a structural test.

12. The method of claim 10, wherein the first test is a functional test.

13. The method of claim 10, wherein the first test is a parametric test.

14. The method of claim 10, wherein the tester has a plurality of tester pins and wherein coupling includes coupling all the tester pins to device pins during the first test.

15. The method of claim 10, wherein the tester has a plurality of tester pins and wherein coupling includes coupling all the tester pins to device pins during the first test and the second test.

16. The method of claim 10, wherein performing the first test comprises:
coupling device pins from a first group of the first plurality of devices to the tester;
performing the first test;
coupling device pins from a second group of the first plurality of devices to the tester; and
performing the first test.

17. The method of claim 10, wherein coupling socket pins coupled to the second plurality of devices to the tester pins includes coupling socket pins coupled to the second plurality of devices to the tester pins by way of a plurality of multiplexers.

18. A test system for performing a structural, functional, and parametric tests on a plurality of devices, each of the devices having 96 device pins, the test system comprising:
a tester having 384 tester pins;
at least one socket, wherein 64 devices are receivable in the at least one socket; and
a plurality of 384 multiplexers, each of the multiplexers having a single input coupled to a single respective one of the tester pins, each of the multiplexers having outputs coupled to device pins of individual devices by way of the at least one socket;
wherein the tester is configurable to perform structural, functional, and parametric tests on the devices without disconnecting the devices from the at least one socket.

19. The test system of claim 18, wherein all of the tester pins are coupled to device pins during all structural, functional, and parametric tests.

20. The test system of claim 1, wherein, during the first test, a first number of device pins of one of the first plurality of devices is coupled to the tester pins, and, during the second test, a second number of device pins of one of the second plurality of devices is connected to the tester pins, the second number being greater than the first number.

* * * * *